United States Patent [19]

Blanchard et al.

[11] Patent Number: 4,774,199

[45] Date of Patent: Sep. 27, 1988

[54] CHARGE TRANSFER DEVICE AND PROCESS OF MANUFACTURING THE SAME

[75] Inventors: Pierre Blanchard, Echirolles; Michel Carquet, Beziers; Philippe Warenbourg, Valence, all of France

[73] Assignee: Thomson-CSF, Paris, France

[21] Appl. No.: 918,931

[22] Filed: Oct. 15, 1986

[30] Foreign Application Priority Data

Oct. 18, 1958 [FR] France ................... 85 15503

[51] Int. Cl.[4] ............................................ H01L 29/78
[52] U.S. Cl. ....................................... 437/029; 437/53; 357/24
[58] Field of Search ...................... 357/24; 437/29, 40, 437/48, 49, 53

[56] References Cited

U.S. PATENT DOCUMENTS

| | | | |
|---|---|---|---|
| 3,795,847 | 3/1974 | Engeler et al. | 357/24 |
| 3,943,543 | 3/1976 | Caywood | 357/24 |
| 4,001,861 | 3/1977 | Carnes | 357/24 |
| 4,215,357 | 7/1980 | Kohyama et al. | 357/24 |
| 4,290,187 | 9/1981 | Stein | 29/576 B |
| 4,347,656 | 9/1982 | Smith et al. | 29/591 |
| 4,365,261 | 12/1982 | Chatterjee et al. | 357/24 |
| 4,402,014 | 8/1983 | Carasso et al. | 357/24 |
| 4,613,402 | 9/1986 | Losee et al. | 29/591 |

OTHER PUBLICATIONS

Siemens Forschungs–Und Entwicklungsbetichte, vol. 4, No. 4, 1975, pp. 226–230, Springer-Verlag, Berlin, DE; U. Ablassmeier et al.: "CCD-Schaltungen Hoher Speicherdichte in Al–Si–Gate-Technologie".

Primary Examiner—Olik Chaudhuri
Attorney, Agent, or Firm—Oblon, Fisher, Spivak, McClelland & Maier

[57] ABSTRACT

Process of manufacturing a charge transfer device wherein lower electrodes have enlarged portions and narrowed portions which mesh with the mating portions of any adjacent lower electrode, upper electrodes cover the intervals defined between adjacent lower electrodes and at least part of said enlargened portions thereof, these intervals which are not covered by the upper electrodes are subjected to an impurity diffusion.

5 Claims, 3 Drawing Sheets

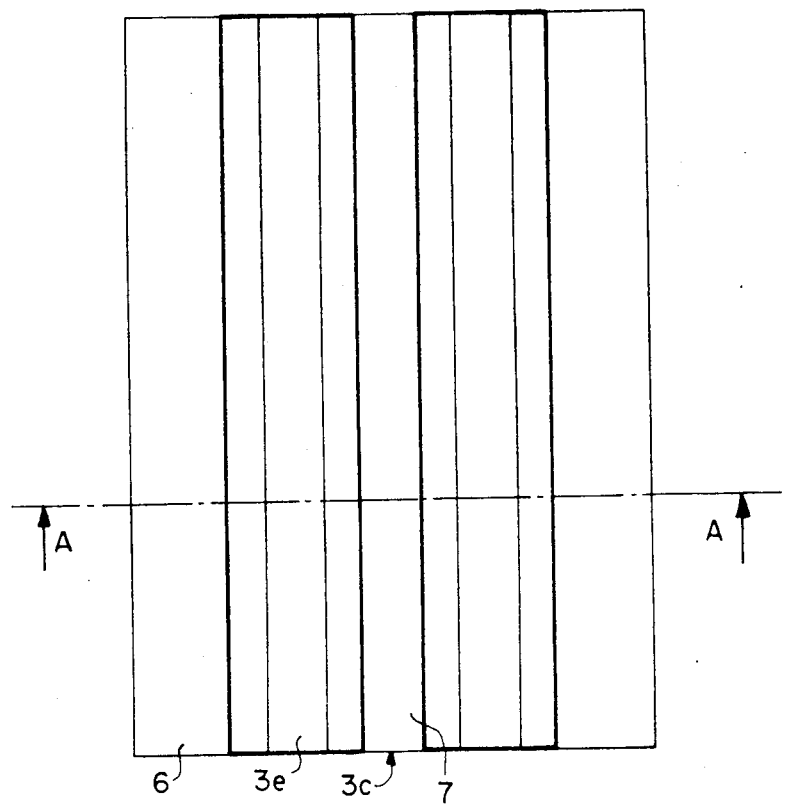
FIG_1 PRIOR ART
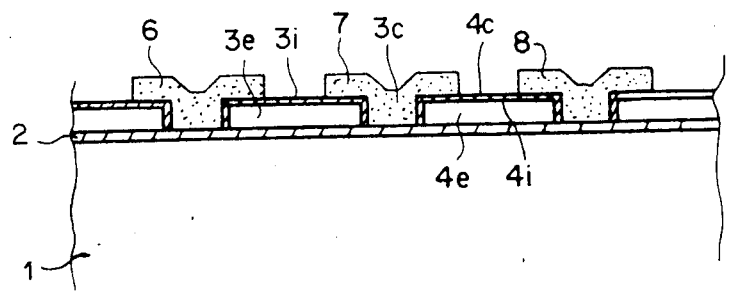
FIG_2 PRIOR ART

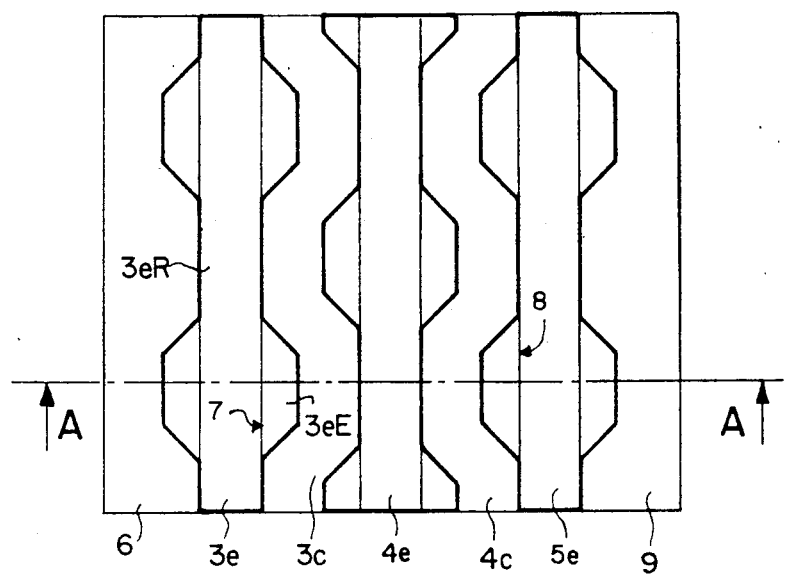
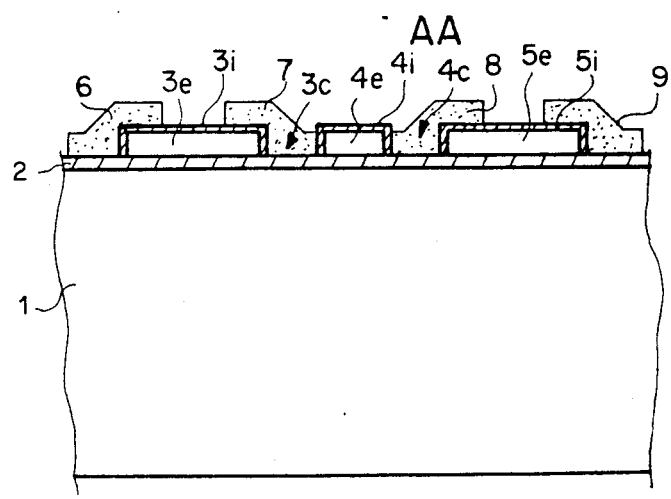

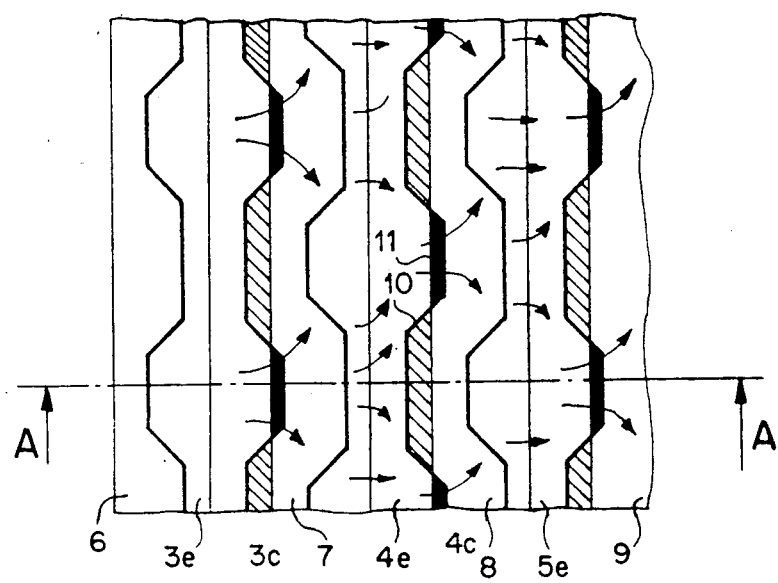
FIG_5
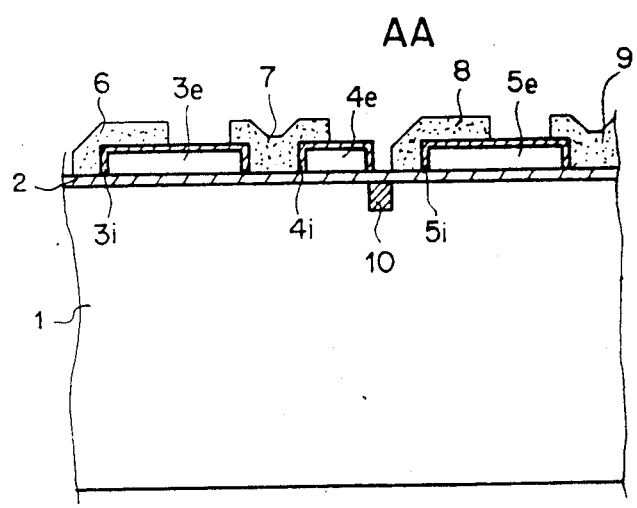
FIG_6

CHARGE TRANSFER DEVICE AND PROCESS OF MANUFACTURING THE SAME

BACKGROUND OF THE INVENTION

The present invention is related to a process of manufacturing a charge transfer device, aimed at reducing the size of such device. The invention is also relates to a small-size charge transfer device.

The conventional process which makes use of a photolitho-engraving technique, which allows a resolution of 2.5 μm to be obtained, only allows a minimum repetition step of 8 μm. The research leading to the present invention was aimed at allowing this step to be reduced, the result of said research being a novel process.

SUMMARY OF THE INVENTION

Thus it is an object of the invention to provide a process of manufacturing a charge transfer device, comprising the successive steps of:
  (1) forming a layer of insulating material on one surface of a substrate constituted by a doped semiconductor material;
  (2) depositing onto said insulating material layer a first layer of conductive material;
  (3) engraving a plurality of lower electrodes in said first conductive material layer;
  (4) forming a layer of insulating material on said lower electrodes;
  (5) depositing a layer of conductive material onto the thus obtained assembly;
  (6) engraving upper electrodes in said conductive material layer,
wherein said step (3) of engraving said lower electrodes is carried out by means of a mask so shaped that the resulting electrodes define a plane parallel to one face of said substrate, as well as enlarged portions and narrowed portions, the enlarged and narrowed portions of an electrode being arranged to mesh with the narrowed and enlarged portions of the adjacent electrode(s) in such a manner that the interval thus defined between any two adjacent electrodes has a constant width, and wherein said step (6) of engraving said upper electrodes is carried out by means of a mask shaped so that it allows upper electrodes to be formed which cover the intervals defined between any two adjacent ones of said lower electrodes.

The invention is also directed to a charge transfer device comprising, on one surface of a substrate made of doped semiconductor material provided with a layer of insulating material, lower electrodes coated with an insulating material and defining in a plane parallel to said surface of the substrate enlarged portions separated by narrowed portions, the enlarged portions and narrowed portions of an electrode being arranged so as to mesh with the narrowed portions and enlarged portions of the adjacent electrode(s) in such a manner that the interval defined between any two adjacent electrodes has a constant width, each one of said intervals being covered by an upper electrode which also covers the enlarged portions of the electrodes delimiting the interval considered.

These and other aims, objects and features of the invention will be described in a nore detailed manner herein-after with reference to the appended drawings.

BRIEF DESCRIPTION OF THE DRAWING

FIG. 1 is a plan view of a charge transfer device of a conventional type;
FIG. 2 is a sectional view taken along line A—A of FIG. 1;
FIG. 3 is a plan view showing one embodiment of the charge transfer device according to the invention;
FIG. 4 is a sectional view taken along the line A—A of FIG. 3;
FIG. 5 shows, viewed from above, one variant of the charge transfer device according to the invention;
FIG. 6 is a sectional view taken along the line A—A of FIG. 5.

DESCRIPTION OF PREFERRED EMBODIMENTS

The construction of a conventional charge transfer device will first be recalled with reference to FIGS. 1 and 2, with a view to explain more clearly the object of the present invention.

This known device comprises a substrate 1 made of semiconductor material, such as doped silicium, one surface of which is covered with a layer of insulating material, such as silicium oxide. Lower electrodes 3e and 4e coated with an insulating material 3i, 4i are provided on said layer of insulating material. Said electrodes are rectilinear and parallel. An interval 3c is defined between any two adjacent electrodes. Upper electrodes des 6, 7, 8 which are also rectilinear and parallel are provided upon lower electrodes 3e, 4e and their insulating material 3i, 4i so as to overlap said lower electrodes. Upper electrode 6 on the left side partially covers lower electrode 3e. Upper electrode 7 covers the interval 3c and a portion of lower electrodes 3e, 4e. Upper electrode 8 on the right side partially covers lower electrode 4e located on the right side.

In this operating mode the lower electrodes 3e, 4e define in the underlying substrate surfaces which are adapted to accumulate charges. The surfaces located underneath the upper electrodes 6, 7, 8 define barriers, whereas electrode 7 operates alternatively as a barrier and as a passage for the charges considered.

The surface of lower electrodes 3e, 4e should be as large as possible so as to allow a number of charges as high as possible to be stored.

Electrode 7 acting as a barrier and transfer element should have, in the direction of the passage of the charges, the smallest possible width, so as to enhance the speed of the transfer.

Thus the invention is related to a charge transfer device adapted to accelerate the transfer of charges.

A charge transfer device according to the invention will now be described herein-below with reference to FIGS. 3 and 4.

According to the invention, with a view to manufacturing this charge transfer device, an insulating material 2 in the form of a thin layer is formed, in a first manufacturing step, on a substrate made of a semiconductor material such as silicium. Said insulating material may be a silicium oxide, and the process of forming such layer is known per se.

In a second step, a layer of conductive material is deposited.

In a subsequent third step lower electrodes 3e, 4e are formed in the conductive layer by engraving, such as photolitho-engraving. According to the invention, this engraving step is carried out in such a manner that the configuration of the resulting electrodes comprises enlarged portions and narrowed portions. Thus, electrode 3e, for example, presents an enlarged portion 3eE and a narrowed portion 3eR. The enlarged and narrowed portions of electrodes 3e and 4e, respectively, mesh with each other in such a manner that any enlarged portion of electrode 3e is located in front of a narrowed portion of electrode 4e and that interval 3c of constant width is defined between the two electrodes 3e and 4e. This applies to all the lower electrodes.

In a fourth step the thus prepared assembly is covered with an insulating material, so that electrodes 3e, 4e, 5e are coated by a layer of insulating material 3i, 4i, 5i, respectively.

In a fifth step a layer of conductive material is deposited onto the assembly thus obtained.

In a sixth step upper electrodes 6, 7, 8 are cut out, for example by a photolitho-engraving process, said electrodes being so located that they cover (or overlap) the lower electrodes at the locations of the abovementioned enlarged portions. These upper electrodes are rectilinear and parallel; the upper electrode on the left side designated by reference numeral 6 covering the enlarged portions on the left side of lower electrode 3e, whereas the upper electrode 7 covers (or overlaps) the enlarged portions on the right side of lower electrode 3e, the interval 3c and the enlarged portions on the left side of lower electrode 4e. Upper electrode 8 covers the enlarged portions on the right side of lower electrode 4e, interval 4c and the enlarged portions on the left side of lower electrode 5e. Finally, upper electrode 9 covers the enlarged portions on the right side of lower electrode 5e.

Thus, according to the invention, a charge transfer device is obtained, which comprises, on a substrate 1 made of a semiconductor material and covered (coated) with an insulating material 2, lower electrodes 3e, 4e, 5e having enlarged portions 3eE and narrowed portions 3eR. These electrodes are disposed with respect to each other in such a manner that their respective enlarged portions and their respective narrowed portions are in a meshing relationship.

Said lower electrodes 3e, 4e, 5e are coated with an insulating material 3i, 4i, 5i. Said upper electrodes 6, 7, 8 cover (or overlap) partially the lower electrodes 3e, 4e, 5e.

This covering or overlapping relationship is such that the upper electrodes cover the intervals defined between any two adjacent lower electrodes, as well as the enlarged portions of said lower electrodes.

Owing to these features the level of the electrodes used for storing the storing charges is alternatively enlarged and narrowed, thereby forming privileged sites. The provision of enlarged portions further allows to overlap simultaneously portions of lower electrodes and upper electrodes, respectively, so as to allow the charges to pass during transfer.

However producing the upper electrodes by engraving may entail a shifted position thereof, which results in the fact that certain enlarged portions are not entirely coated. The invention allows this drawback to be overcome and allows consequently engraving of the lower and upper electrodes with a comparatively reduced precision.

Indeed, after the above sixth step of previously engraving, the invention provides a seventh step of implanting or diffusing impurities.

As shown in FIG. 6, upper electrodes 6, 7, 8, 9 may be shifted towards the right, for example, with respect to lower electrodes 3e, 4e, 5e. In this case, they overlap or cover only part of the enlargened portions of the lower electrodes. Thus, as best shown in FIG. 5, upper electrode 8 covers only the blackened portions, designated by reference numeral 11, of lower electrode 4e. On the other hand, it fails to cover the hatched portions designated by numeral 10.

The non coated (hatched) portions of intervals 3c, 4c can constitute the site of parasitic (or "noise") charge pockets.

Thus the present invention, by providing a step of ionic implanting or diffusing impurities results in the formation of barriers such as 10 (cf. FIG. 6) in the hatched zones. This implantation or diffusion which is self aligned with the lower and upper electrodes inhibits the formation of parasite pockets and prevents the passing of the charges.

During charge transfer, the charges pass through the zones located beneath the blackened zones of the lower electrodes, as indicated by the arrows mentioned in connection with FIG. 5.

Thus it can be seen that, according to the invention, due to the self-aligning of said implantation with reference to the electrodes, the position of the level of the upper electrodes with respect to the lower electrodes can be modified without impeding the operation of the structure.

The resulting configuration allows to produce a structure having a pitch of 6.5 $\mu$m without modifying the process of photolitho-engraving the lower and upper electrodes. This structure can be applied to various types of charge transfer devices using two different electrode levels.

The invention is not limited to the embodiments shown and described herein. Many modifications and variants may be envisaged by those skilled in the related art, without departing from the spirit and scope of the invention as defined in the appended claims.

We claim:

1. A process of manufacturing a charge transfer device, comprising the successive steps of:
   (a) forming a layer of insulating material on one surface of a substrate constituted by a doped semiconductor material;
   (b) depositing onto said insulating material layer a first layer of conductive material;
   (c) engraving a plurality of lower electrodes in said first conductive material layer;
   (d) forming a layer of insulating material on said lower electrodes;
   (e) depositing a layer of conductive material onto the thus obtained assembly;
   (f) engraving upper electrodes in said conductive material layer, wherein said step (c) of engraving said lower electrodes is carried out by means of a mask so shaped that the resulting electrodes define a plane parallel to one side of said substrate, as well as enlarged portions and narrowed portions, the enlarged and narrowed portions of an electrode being arranged to mesh with the narrowed and enlarged portions of the adjacent electrode(s) in such a manner that the interval thus defined between any two adjacent electrodes has a constant width, and wherein said step (f) of engraving said upper electrodes is carried out by means of a mask shaped so that it allows upper electrodes to be formed which cover the intervals defined between any two adjacent ones of said lower electrodes.

2. A process according to claim 1, wherein said step (f) of engraving said upper electrodes is carried out by means of a mask which takes into account the possibility that said upper electrodes do not entirely cover the intervals defined between any two adjacent lower electrodes.

3. A process according to claim 1, which further comprises a further step of impurity implantation.

4. A process according to claim 1, which further comprises a further step of impurity diffusion.

5. A process according to claim 1, wherein the isolating material used in step (a) is a silicium oxide.

* * * * *

UNITED STATES PATENT AND TRADEMARK OFFICE
CERTIFICATE OF CORRECTION

PATENT NO. : 4,774,199

DATED : Sep. 27, 1988

INVENTOR(S) : Pierre BLANCHARD et al.

It is certified that error appears in the above-identified patent and that said Letters Patent is hereby corrected as shown below:

On the Title Page, Item [30]:

The Foreign Application Priority Data is incorrect; should read as follows:

-- Oct. 18, 1985  [FR]  France ...............85 15503 --

Signed and Sealed this

Fourteenth Day of February, 1989

Attest:

DONALD J. QUIGG

*Attesting Officer*  *Commissioner of Patents and Trademarks*